United States Patent
Nakhla et al.

(10) Patent No.: US 8,543,360 B2
(45) Date of Patent: Sep. 24, 2013

(54) PARALLEL SIMULATION OF GENERAL ELECTRICAL AND MIXED-DOMAIN CIRCUITS

(75) Inventors: Michel Nakhla, Ottawa (CA); Ramachandra Achar, Ottawa (CA); Douglas Paul, Ottawa (CA); Natalie Nakhla, Ottawa (CA)

(73) Assignee: Omniz Design Automation Corporation, Ottawa (CA)

( * ) Notice: Subject to any disclaimer, the term of this patent is extended or adjusted under 35 U.S.C. 154(b) by 442 days.

(21) Appl. No.: 12/828,251

(22) Filed: Jun. 30, 2010

(65) Prior Publication Data

US 2010/0332202 A1 Dec. 30, 2010

Related U.S. Application Data

(60) Provisional application No. 61/221,667, filed on Jun. 30, 2009.

(51) Int. Cl.
*G06F 7/60* (2006.01)
*G06F 17/10* (2006.01)

(52) U.S. Cl.
USPC .......................................................... 703/2

(58) Field of Classification Search
USPC .......................................................... 703/2
See application file for complete search history.

(56) References Cited

U.S. PATENT DOCUMENTS

| | | | |
|---|---|---|---|
| 5,157,778 A | 10/1992 | Bischoff et al. | |
| 5,313,398 A | 5/1994 | Rohrer et al. | |
| 5,379,231 A | 1/1995 | Pillage et al. | |
| 7,428,477 B1 | 9/2008 | Phillips et al. | |
| 7,444,604 B2 | 10/2008 | Croix et al. | |
| 2007/0157135 A1 | 7/2007 | Yang | |
| 2008/0140379 A1 | 6/2008 | Shah et al. | |
| 2008/0208553 A1 | 8/2008 | Borah et al. | |

OTHER PUBLICATIONS

Noda et al. "Reduced-Order Realization of a Nonlinear Power Network Using Companion-Form State Equations with Periodic Coefficients", IEEE 2003.*
J. Vlach et. al., "Computer Methods for Circuit analysis and Design", New York; Van Nostrand, 1983, chapters 3 and 4.
L. W. Nagel, "SPICE2: A computer program to simulate semiconductor circuits", Memo No. ERL-M529, Electronics Research Lab, University of California, Berkeley, May 1975.
N. Frohlich et. al., "A new approach for parallel simulation of VLSI Circuits on a transistor level", IEEE transactions on circuits and systems—I, Jun. 1998, pp. 601-613, 13 pages.

(Continued)

*Primary Examiner* — Saif Alhija
(74) *Attorney, Agent, or Firm* — Moffat & Co.

(57) ABSTRACT

A new method for simulation of general electrical circuits on parallel computing platforms is disclosed. Parallel simulation of general time-domain circuits that are represented by nonlinear/linear differential algebraic equations is accomplished by partitioning them into smaller subcircuits via a novel combination of the companion form representation of the given circuit and an efficient form of node splitting, during Newton Raphson iterations, at any time point. The new invention formulates the interface vectors between partitions, through purely binary vectors, leading to a high degree of parallelism, scalability and reduced computational and communication costs for synchronizing the solutions between various partitions. Parallel platforms considered can be diverse such as (including but not restricted to) multicore CPUs, distributed systems of computers. The new invention also provides for scalable parallel simulation of mixed-domain formulations, such as (including but not restricted to), integrated circuits, electronic packages, PCBs, electromagnetic modules, MEMS and optical components etc.

18 Claims, 10 Drawing Sheets

(56) References Cited

OTHER PUBLICATIONS

R. Rohrer, "Circuit partitioning simplified", IEEE transactions on circuits and systems—I, Jan. 1998, pp. 2-5, 4 pages.

G. Kron, Diakoptics, "Tensor Analysis of Networks", New York, Wiely, 1939, chapter XXII.

J. White, et. al., "Partitioning algorithms and parallel implementation of waveform relaxation techniques for circuit simulations", Proceedings of ISCAS-85, pp. 221-224, 4 pages.

A. R. Newton et. al., "Relaxation based circuit simulation", IEEE transactions on circuit theory, Oct. 1984, pp. 308-330, 23 pages.

E. Lelarasmee et. al., "The waveform relaxation method for time-domain analysis of large scale integrated circuits," IEEE Trans. Computer-Aided Design, Aug. 1982, pp. 131-145, 15 pages.

J. White et. al, "Relaxation Techniques for the Simulation of VLSI Circuits", Norwell, MA: Kluwer, 1987, table of contents.

N. Nakhla, et. al., "Simulation of coupled interconnects using waveform relaxation and transverse partitioning", IEEE Transaction on Advanced Packaging, Feb. 2006, pp. 78-91, 14 pages.

R. Achar et. al., "Simulation of High-speed Interconnects", Proceedings of the IEEE, May 2001, pp. 693-728, 35 pages.

R. Saleh, et. al., Accelerating relaxation algorithms for circuit simulation using waveform-Newton and step-size refinement, IEEE Transactions on computer-aided design, pp. 951-958, Sep. 1990 (7 pages).

\* cited by examiner

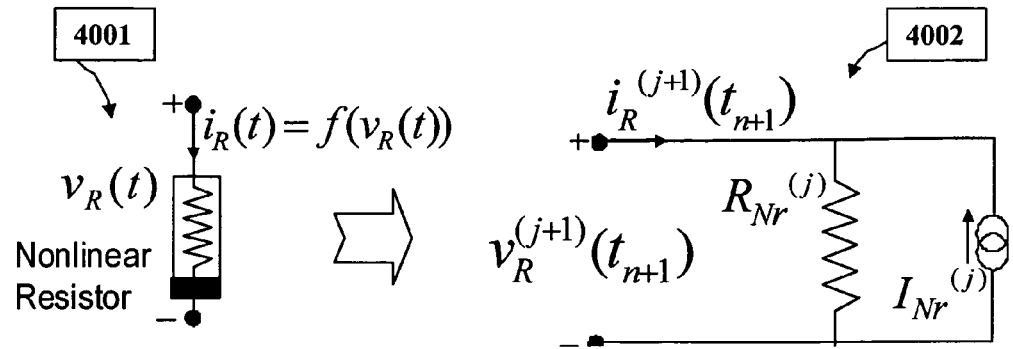

$$i_R^{(j+1)}(t_{n+1}) = f(v_R^{(j)}(t_{n+1})) + \quad \leftarrow \boxed{4003}$$

$$\frac{\partial(f(\hat{v}_R))}{\partial \hat{v}_R}\bigg|_{\hat{v}_R = v_R^{(j)}(t_{n+1})} \{v_R^{(j+1)}(t_{n+1}) - v_R^{(j)}(t_{n+1})\}$$

$$= (1/R_{Nr}^{(j)}) \times (v_R^{(j+1)}(t_{n+1})) - I_{Nr}^{(j)}; \quad \leftarrow \boxed{4004}$$

$$R_{Nr}^{(j)} = \left[\frac{\partial(f(\hat{v}_R))}{\partial \hat{v}_R}\right]^{-1}\bigg|_{\hat{v}_R = v_R^{(j)}(t_{n+1})}; \quad \leftarrow \boxed{4005}$$

$$R_{Nr}^{(j)} = \left(\frac{\partial(f(\hat{v}_R))}{\partial \hat{v}_R}\bigg|_{\hat{v}_R = v_R^{(j)}(t_{n+1})}\right) \times v_R^{(j)}(t_{n+1}) - \quad \leftarrow \boxed{4006}$$

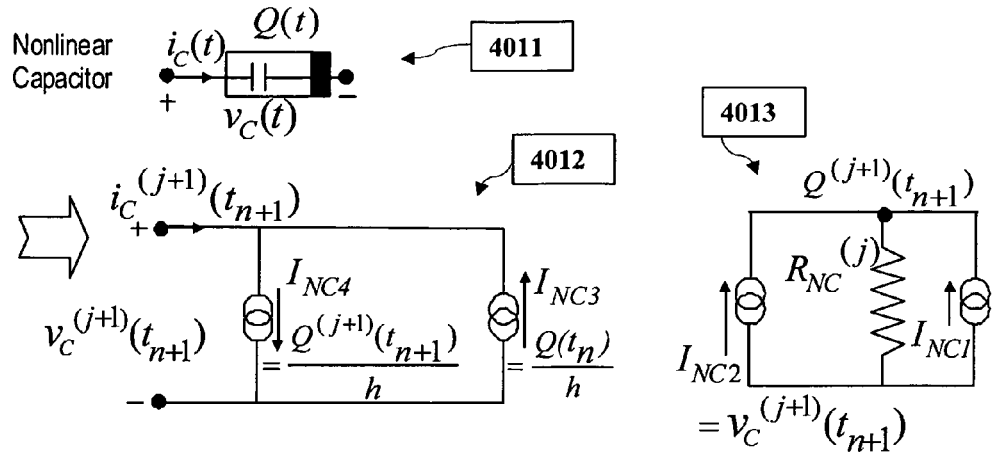

$$i_C(t) = \frac{dQ(t)}{dt}; \quad Q(t) = f(v_C(t)); \quad \leftarrow \boxed{4014}$$

$$v_C^{(j+1)}(t_{n+1}) = \left(1 \middle/ R_{NC}^{(j)}\right) \times Q^{(j+1)}(t_{n+1}) + I_{NC2}; \quad \leftarrow \boxed{4015}$$

$$R_{NC}^{(j)} = \left[\frac{\partial(f(v_C))}{\partial v_C}\right]\bigg|_{v_C = v_C^{(j)}(t_{n+1})}; \quad \leftarrow \boxed{4016}$$

$$I_{NC2} = v_C^{(j)}(t_{n+1}) - \left[\frac{\partial(f(v_C))}{\partial v_C}\right]^{-1}\bigg|_{v_C = v_C^{(j)}(t_{n+1})} \times f(v_C^{(j)}(t_{n+1})) \quad \leftarrow \boxed{4017}$$

$$i_C^{(j+1)}(t_{n+1}) = \frac{Q^{(j+1)}(t_{n+1})}{h} - \frac{Q(t_n)}{h} = I_{NC4} - I_{NC3} \quad \leftarrow \boxed{4018}$$

Fig. 4B $$\mathbf{x} = \begin{bmatrix} v_1 & v_2 & v_3 & v_4 \end{bmatrix}^T ; \quad \leftarrow \boxed{6006}$$

$$\mathbf{G}_1 \hat{\mathbf{x}}_1 = \mathbf{b}_1; \quad \mathbf{G}_1 = \begin{bmatrix} \frac{1}{R_d} & -\frac{1}{R_d} \\ -\frac{1}{R_d} & \frac{1}{R_d} + \frac{1}{R_{Ca}} \end{bmatrix} ; \quad \hat{\mathbf{x}}_1 = \begin{bmatrix} \hat{v}_1 \\ \hat{v}_{12} \end{bmatrix};$$
$$\nearrow$$
$$\boxed{6007}$$

$$\mathbf{b}_1 = \begin{bmatrix} I_1 \\ I_{Ca} \end{bmatrix}; \quad \mathbf{Q}_1 = \begin{bmatrix} 0 \\ 1 \end{bmatrix}$$

$$\boxed{6008}$$
$$\searrow$$
$$\mathbf{G}_2 \hat{\mathbf{x}}_2 = \mathbf{b}_2; \quad \mathbf{G}_2 = \begin{bmatrix} \frac{1}{R_e} & -\frac{1}{R_e} \\ -\frac{1}{R_e} & \frac{1}{R_e} + \frac{1}{R_{Nr}} + \frac{1}{R_{Cb}} \end{bmatrix} ;$$

$$\mathbf{b}_2 = \begin{bmatrix} 0 \\ I_{Nr} + I_{Cb} \end{bmatrix}; \quad \hat{\mathbf{x}}_2 = \begin{bmatrix} \hat{v}_{22} \\ \hat{v}_{23} \end{bmatrix} ; \quad \mathbf{Q}_2 = \begin{bmatrix} -1 & 0 \\ 0 & 1 \end{bmatrix}$$

$$\mathbf{G}_3 \hat{\mathbf{x}}_3 = \mathbf{b}_3; \quad \mathbf{G}_3 = \begin{bmatrix} \frac{1}{R_m} & -\frac{1}{R_m} \\ -\frac{1}{R_m} & \frac{1}{R_m} + \frac{1}{R_{Cc}} \end{bmatrix} ; \hat{\mathbf{x}}_3 = \begin{bmatrix} \hat{v}_{33} \\ \hat{v}_4 \end{bmatrix};$$
$$\nearrow$$
$$\boxed{6009}$$

$$\mathbf{b}_3 = \begin{bmatrix} 0 \\ I_{Cc} \end{bmatrix}; \quad \mathbf{Q}_3 = \begin{bmatrix} -1 \\ 0 \end{bmatrix}.$$

Fig. 6B

PARALLEL SIMULATION OF GENERAL ELECTRICAL AND MIXED-DOMAIN CIRCUITS

CLAIM OF PRIORITY

This Application claims the benefit of U.S. Provisional Patent Application No. 61/221,667, filed on Jun. 30, 2009, titled "Parallel Simulation of General Electrical and Mixed-Domain Circuits"; provisional application being incorporated herein by reference in its entirety.

FIELD OF THE INVENTION

The present invention relates to a general circuit simulator focused on linear, nonlinear circuits and mixed-domain formulations, and more specifically, to a parallel simulator for performing DC, time-domain and frequency-domain analysis in parallel by employing a plurality of workstations, multi-core computers or a distributed cluster of computers.

BACKGROUND AND THE RELATED ART

Verification and prediction of timing behavior of circuit designs is an integral part of electronic design automation (EDA). This is accomplished through computer aided circuit analysis programs, generally referred to as circuit simulators. Simulating a circuit's behavior prior to manufacturing provides insights into the behavior of electronic circuit designs. Accurate prediction of timing behavior during various stages of the design cycle is necessary to avoid expensive post-design corrective measures, delayed time-to-market and failed design cycles.

The circuit is typically described by the connectivity information among various components and devices, using various means, such as netlists, schematic diagrams, textual data etc. The devices/components are represented by appropriate models representing their physical behavior. Most models try to replicate the behavior of their real-world counter-parts. Each model is defined by a current/voltage equation.

The traditional method for simulation of general electrical circuits and mixed-domain systems is given as a flow chart in FIG. 1. This involves mapping the circuit connectivity information 1001 and the model description 1002 into a set of circuit equations 1003. This is usually done through a formulation, known as modified nodal analysis (MNA). The MNA formulation is well known, and is documented in several references such as in, J. Vlach et. al., "Computer Methods for Circuit Analysis and Design", New York: Van Nostrand, 1983. These MNA equations are generally in the form of nonlinear differential algebraic equations (NDAEs) and can consist of large number of variables. Such a set of equations is typically represented in the matrix form, where the order of the associated matrices can be very large. For the purpose of illustration, a nonlinear circuit can be represented using the modified nodal analysis in the form of NDAEs, as $$Gx(t) + C\dot{x}(t) + f(x(t)) = b(t) \qquad \text{(Eq. 1)}$$

where x(t) contains the states of the circuit as a function of time, $\dot{x}(t)$ is the time derivative of these states, G is the modified nodal conductance matrix, C is the modified nodal susceptance matrix, f(x(t)) describes the nonlinear devices, while b(t) specifies the voltage and current sources in the circuit.

A time-domain simulation to determine the behavior of a circuit over a time-span of interest involves solution of the above described NDAEs, which typically consists of the following sequence (FIG. 1):

a) Perform a DC analysis (at t=0) 1004 using the initial conditions of the circuit, and obtain the DC solution. The circuit equations for DC analysis generally take the form of nonlinear algebraic equations and are solved using Newton-Raphson iterations.

b) Let $t_n$ be the previous time point and set n=0 & $t_n$=0 1005. Determine the next time point for solution, by selecting an appropriate time-step size 'h'. Let $t_{n+1}$ be the current time point with $t_{n+1}=t_n+h$ 1006.

c) Apply an appropriate integration method (such as Trapezoidal Formula, Backward Euler Formula or any Multi-Step Integration Formula, etc.) 1007 to translate the given set of NDAEs to a set of nonlinear algebraic equations 1008 at the particular time point of interest.

d) Solve the set of nonlinear algebraic equations using Newton-Raphson iterations 1008, until the solution convergence is achieved. This step involves solving the large matrix using LU decomposition and forward/backward substitutions at each iteration. This step becomes a highly time consuming process, when the order of the matrix is large.

e) Check if the predefined truncation error tolerance $\epsilon_{te}$ is satisfied 1009. If the error is not satisfied, modify the step size and repeat steps c) to e). If the error is satisfied, check if the maximum time point of interest has been reached 1010. If not, set n=n+1 1011, move to the next time point and repeat steps c) to e), until the time-domain results are computed for the desired time-span of interest.

For the purpose of illustration, if the Backward Euler integration method is applied on the NDAEs represented by (1), then the corresponding difference equation (nonlinear algebraic) is given by $$\left(G + \frac{C}{h}\right)x_{n+1} + f(x_{n+1}) = \frac{C}{h}x_n + b_{n+1} \qquad \text{(Eq. 2)}$$

where $x_n = x(t_n)$, $x_{n+1} = x(t_n+h)$, $b_{n+1} = b(t_n+h)$. To solve this set of nonlinear algebraic equations, algorithms such as the Newton-Raphson method are used, where this equation is reformulated in terms of linearized equations and solved iteratively using LU decomposition and forward/backward substitution (at each iteration). For the purpose of illustration of the steps, let $$\Phi(x_{n+1}) = \left(G + \frac{C}{h}\right)x_{n+1} + f(x_{n+1}) - b_{n+1} - \frac{C}{h}x_n \qquad \text{(Eq. 3)}$$

Let the Jacobian matrix, constructed using the derivative of $\Phi(x_{n+1})$ be represented by $$J = \frac{\partial(\Phi(x_{n+1}))}{\partial x_{n+1}} \qquad \text{(Eq. 4)}$$

Solution at the current time point, $x_{n+1}=x(t_n+h)$, involves solving nonlinear algebraic equations of (3) using Newton-Raphson (NR) iterations 1008. The process of NR iterations is detailed in the flow chart of FIG. 2. To begin with, the solution is initialized to the response at the previous time point 2001 during a transient analysis (or to the DC initial conditions during a DC analysis 1004). In each iteration 2002, computing the NR update (Δx) requires forming an updated Jacobian matrix (J) and solving the corresponding equations 2003. For example, at $(j+1)^{th}$ NR iteration, the Jacobian and the right hand side are evaluated based on the solutions from the $j^{th}$ iteration as:

$$J|_{x_{n+1}^{(j)}} \Delta x = -\Phi|_{x_{n+1}^{(j)}} \quad \text{(Eq. 5)}$$

Equation (5) is typically solved using LU decomposition, forward and backward substitution. For example, matrix J can be decomposed into product of two triangular matrices, a lower triangular matrix (L) and an upper triangular matrix (U) (the process is popularly known as LU decomposition), in the form:

$$J = LU \quad \text{(Eq. 6)}$$

which is a highly time consuming process when the order of the matrix is large. Subsequently, the NR update (Δx) is obtained using forward and backward substitutions as $$LZ = -\Phi|_{x_{n+1}^{(j)}}; \quad U\Delta x = Z; \quad \text{(Eq. 7)}$$

Once the (Δx) is obtained, the updated solution at the $(j+1)^{th}$ iteration, $x_{n+1}^{(j+1)}$, is obtained 2004. Subsequently, the updated solution is checked for convergence by comparing it against a predefined NR iteration error tolerance, $\epsilon_{nr}$, 2005. If the error is not satisfied, set j=j+1 2006, and move to the next iteration. If the error is satisfied, set the final solution 2007 for the time point $t_{n+1}$ as $x_{n+1} = x_{n+1}^{(j+1)}$.

In a typical transient analysis involving thousands of time points (note that each time point solution requires several NR iterations), evaluation of the NR update (Δx) using (5) & (6) constitutes the bulk of the computational cost.

An additional factor that influences the computational cost of the solution using (5), (6) and (7) is the sparsity (which corresponds to the number of zero entries in the matrix) of the matrix. In general, computational cost is proportional to $N^\sigma$ where N represents the original matrix size and σ depends on the sparsity of matrix J. For typical circuits, σ varies from 1.3 to 2.4. Obviously, larger the N, larger is the computational cost. For modern electronic circuits, N can be very large, in the range of millions. Hence it is desirable to approach the circuit simulation problem by dividing the original circuit into several smaller subcircuits (say of size $N_s$, $N_s \ll N$), and solving each subcircuit independently (to exploit the fact that $N_s^\sigma \ll N^\sigma$) and combining the subcircuit results to get the solution of the original circuit. This has been attempted through several previous approaches, such as waveform relaxation, as in, J. White et. al., "Relaxation Techniques for the Simulation of VLSI Circuits", Norwell, Mass.: Kluwer, 1987, and domain-decomposition techniques, such as described in, N. Frohlich et. al., "A new approach for parallel simulation of VLSI Circuits on a transistor level", IEEE transactions on circuits and systems-I, June 1998, pp. 601-613.

Waveform relaxation techniques approached the large circuit and parallel computing problem by independently computing the entire waveform for subcircuits over a time duration of interest assuming some initial waveforms. These waveforms were iteratively refined to obtain the final waveform for the entire circuit. The main issue with the waveform relaxation approaches is the convergence, which is not guaranteed in the case of general circuits. This has inhibited the use of waveform relaxation in general circuit simulators.

In the case of domain-decomposition based techniques, given the system of original circuit equations (Ax=b), partitions and interface variables are identified. These interface variables are extracted as a subset of the MNA (modified nodal analysis) variables. While ordering the MNA, these interface variables are ordered towards the end. This leads to a domain-decomposed form for the original circuit, with block diagonal matrices for the subcircuits and two border rectangular (one vertical and one horizontal) matrices comprising interface variables as, $$\begin{bmatrix} A_1 & & & F_1 \\ & A_2 & & F_2 \\ & & \ddots & \vdots \\ M_1 & M_2 & \ldots & C \end{bmatrix} \begin{bmatrix} x_1 \\ x_2 \\ \vdots \\ x_{k+1} \end{bmatrix} = \begin{bmatrix} b_1 \\ b_2 \\ \vdots \\ b_{k+1} \end{bmatrix} \quad \text{(Eq. 8)}$$

where $A_j$ represents an individual domain (i.e., partition) and $M_j$, $F_j$ describe the MNA variables that are interfacing $A_j$ to other subcircuits and 'C' represents the interconnecting matrix linking all subcircuits. Each partition is solved independently and synchronized using a master process at each Newton iteration. However, the above approach met with little success for parallel computation, mainly due to the fact that the matrices $M_j$ and $F_j$ contain the original MNA variables and are non-binary matrices. Consequently, solution cost of interconnecting equations (solved on a master processor) as well as the communication cost among slaves and the master processor grow rapidly with the increasing number of partitions. This causes poor scalability with the increasing number of processors and partitions. Also, in many cases great care needed to be taken while removing a node from a domain (in order to move it to the border interface matrix), since it could severely affect the solvability of an individual domain, which in turn hampered in the process of efficient partitioning.

Hence, what is needed is a method for accurate and fast transient analysis of large circuits and mixed-domain formulations that effectively partitions the given problem while providing a mechanism requiring minimum computational/communication cost to synchronize the solution among different partitions/processors.

SUMMARY OF THE INVENTION

The new invention provides for fast as well as accurate time-domain circuit and mixed-domain simulation on both multiprocessor and single processor environments.

In one embodiment, the new invention provides for parallel simulation of general time-domain circuits that are represented by nonlinear/linear differential algebraic equations (NDAEs) by partitioning them into smaller subcircuits via a novel combination of the companion form representation of the given circuit and an efficient form of node splitting, during Newton Raphson iterations, at any time point.

The new invention presents for coarse-grain parallelization of NR iterations by minimizing the computations required for synchronizing/interfacing/updating various parallel blocks as well as minimizing the communication overhead between the processors involved.

The new invention formulates the interface vectors between partitions, through purely binary vectors. The important merits of the new invention comes from a novel combination of the companion form of the circuit and an efficient form of node splitting, leading to interfacing vectors between various partitioned blocks, $q_{kj}$, to be purely binary in nature, with all entries '0', except for only one of the entries in them containing '±1'. This leads to significant reduction in the computation/communication cost among processors during parallel computation.

The new invention can also be used on a single processor with the proposed partitioning scheme. In this case, each partition is solved serially, and synchronized later on to obtain the solution of the original circuit at each NR iteration. Because of the fact that the subcircuits to be solved at a time are much smaller compared to the original circuit and computational costs for synchronization are kept to the minimum, the new invention yields significant speed-ups even when executed on a single processor, compared to simulating the original circuit as is.

A hierarchical approach can also be adopted using the proposed invention, wherein, while doing the parallel analysis of subcircuits on slave processors, they can be further partitioned and solved serially. Further, as an alternative to direct multi-way partitioning, hierarchical partitioning can also be used to reduce the overall number of links among the subcircuits. In hierarchical partitioning, the original circuit is partitioned into a certain number of subcircuits, and each of these subcircuits is then partitioned again, and so on as required. This results in a tree structure of subcircuits, which can be simulated by applying the methods of this invention recursively to the structure.

The new invention can also be adopted for parallel DC analysis of linear/nonlinear circuits. It can also be adopted for frequency-domain analysis of general circuits.

The new invention allows for scalable circuit simulation on diverse parallel platforms such as (including but not restricted to) multicore CPUs, distributed systems of computers as well as a cluster of computers. A cluster of computers can even be connected via the local area network, wireless network or even through the internet. The new invention can also handle parallel simulation of mixed-domain formulations, such as (including but not restricted to), integrated circuits, electronic packages, printed circuit boards, multichip modules electromagnetic modules, MEMS and optical devices etc.

BRIEF DESCRIPTION OF THE DRAWINGS

The new invention can be easily understood by the following detailed drawings and detailed descriptions. The provided drawings illustrate only the preferred embodiments of the invention and therefore should not be considered as limiting in scope. Persons of ordinary skills in the art with the benefit of this description appreciate that the disclosed inventive concepts lend themselves to other equally effective embodiments.

FIG. 4A illustrates the concept of constructing a companion model for a nonlinear resistor and FIG. 4B illustrates the construction of a companion model for a nonlinear capacitive element when using the Backward Euler integration formula. In the figures, '$t_n$' represents the previous time point and '$t_{n+1}=t_n+h$' represents the current time point, where 'h' is the time step size.

DETAILED DESCRIPTION OF THE EMBODIMENTS

Figure 1:
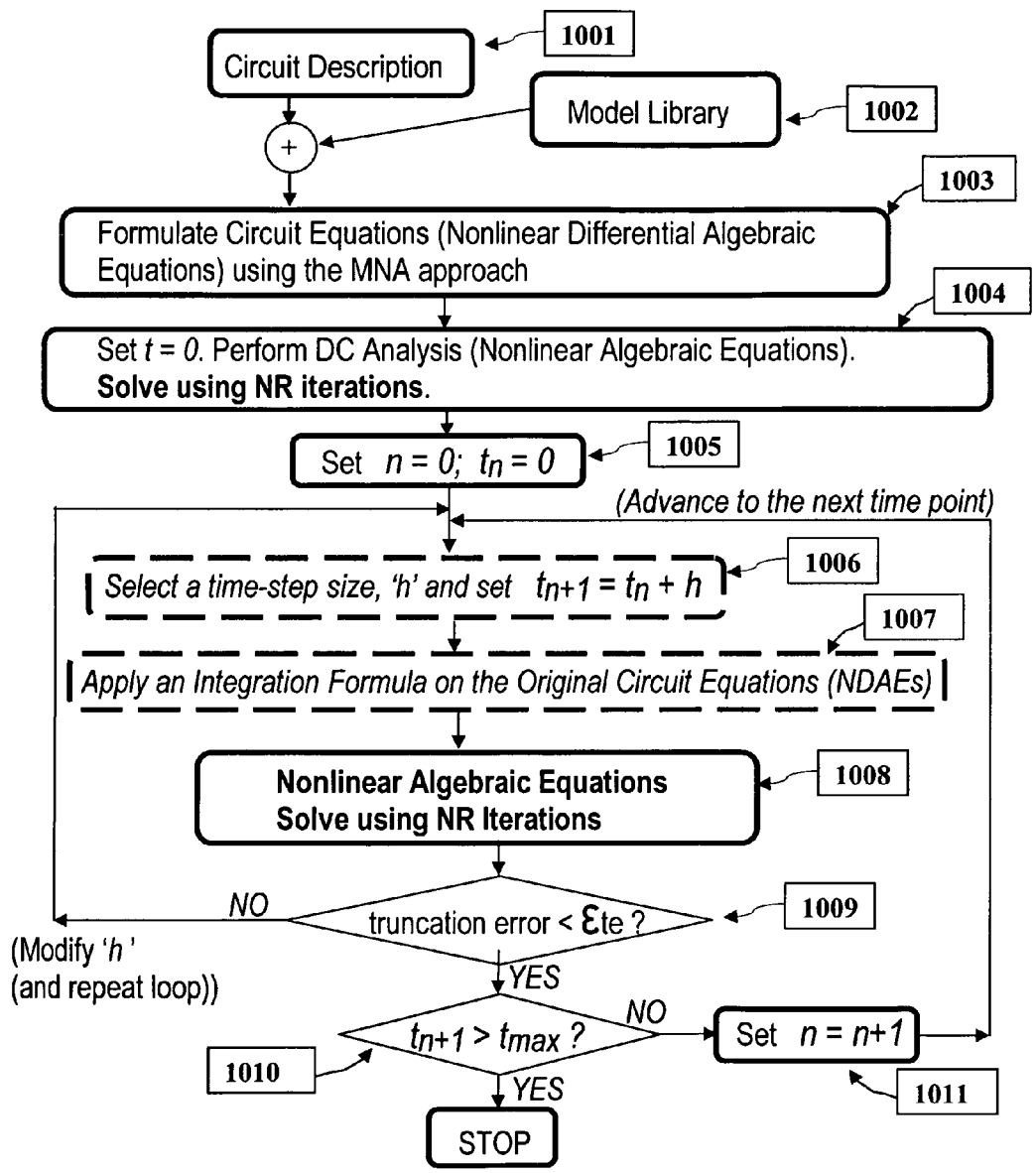
FIG. 1 shows a flow diagram illustrating typical conventional time-domain circuit simulation steps, involving formulation of circuit equations, solution by applying an appropriate integration formula and Newton-Raphson Iterations.
Figure 2:
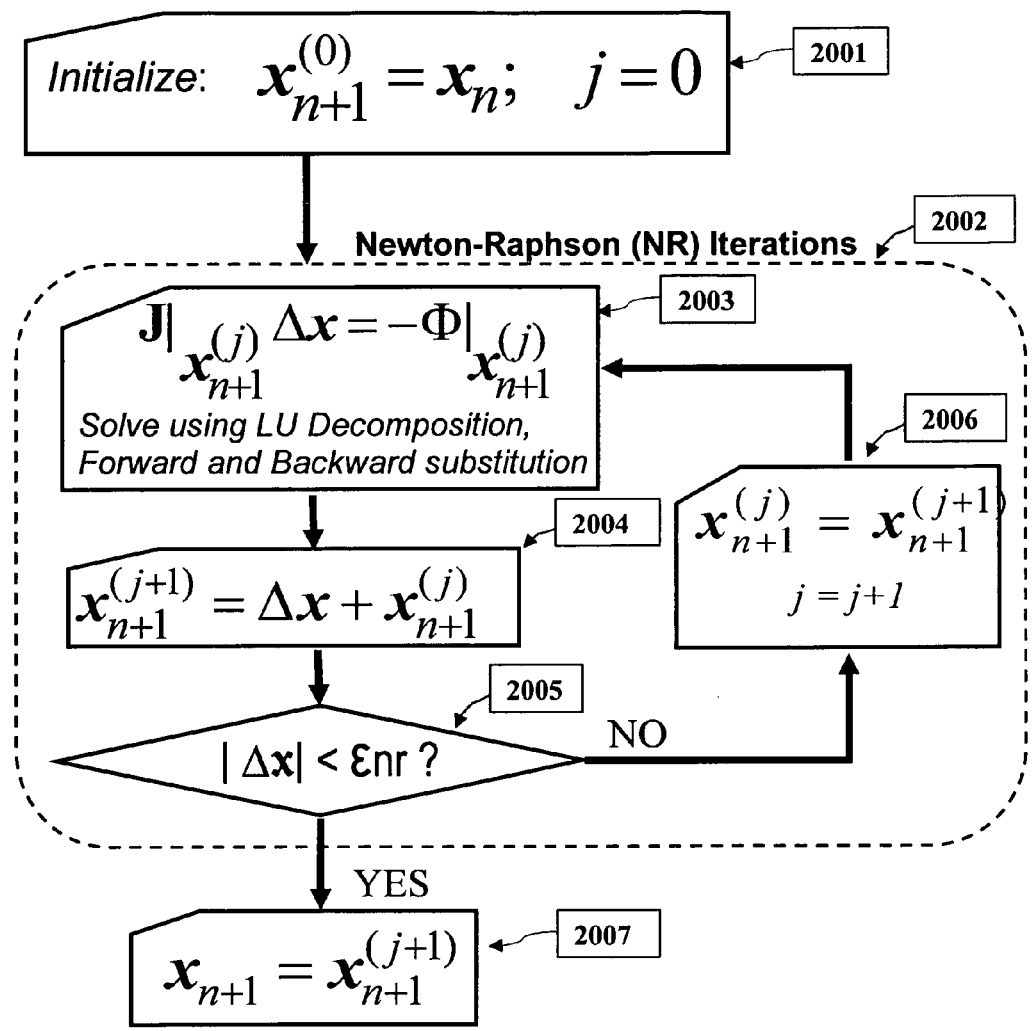
FIG. 2 shows a flow diagram illustrating typical steps, involving solution of nonlinear equations using Newton-Raphson Iterations.

The new invention presents parallel and fast transient analysis of general time-domain circuits that are represented by nonlinear/linear differential algebraic equations (NDAEs) via fast parallel computation of the NR update ($\Delta x$)) at each Newton iteration without any loss of accuracy, while minimizing the computations required for interfacing various parallel blocks as well as minimizing the communication overhead between the processors involved. This is accomplished in this invention via a novel combination of the companion form representation of the given circuit and an efficient form of node splitting, during Newton Raphson iterations, at any time point. Further, since the companion form of the circuit is purely DC in nature, it can be solved via linearized Newton Raphson iterations. At each NR iteration, since the resulting circuit is linear, the technique of node tearing can be applied at the identified partitioning nodes, leading to coupling vectors (linking various resulting subcircuits) that are purely binary in nature, and an impedance matrix whose dimension depends on the number of links between various partitions. Next, each subcircuit is solved independently and in parallel on different CPUs. Subsequently, exact solution for the NR iteration of the original circuit is obtained by appropriately picking the solutions from the subcircuits. The binary nature of the interfacing vectors between various subcircuits as well as the embodiments developed in this invention makes the method highly efficient for circuit simulation on parallel platforms.

In the following, a detailed description of the preferred embodiments of the invention is given. Persons of ordinary skills in the art with the benefit of this description appreciate that the disclosed inventive concepts lend themselves to other equally effective embodiments and may be practiced without some of the specific details or with minor modifications to the described ones here. Also, indicated naming conventions for variables in the provided equations, node and component names in the circuits and figures are purely for the purpose of illustration, which can be done in any way based on an implementer's choice while using the inventive concepts outlined in this application.

First Embodiment

The details of the first preferred embodiment of the new invention for transient analysis are outlined below.

First, construct the graph for the given circuit and identify partitions in the given circuit based on the circuit complexity and the number of processors available, such that the size as well as number of nonlinear elements is fairly distributed among the partitions, while minimizing the links between various partitions.

Subsequently, apply the node splitting at the intended partition nodes and form the corresponding subcircuits as well as the link vectors (which are purely binary in nature) representing the coupling between various subcircuits.

At each time step, solve for the original circuit using NR iterations as follows:

a) Do in parallel on different slave processors:
  a1) Represent/update each subcircuit in its companion form and the corresponding MNA matrices,
  a2) Solve each subcircuit (nonlinear) using LU decomposition,
  a3) Compute the subcircuit port impedance matrix and interface vectors and transmit them to the master processor;

b) Do on master processor: collect the solution information from each subcircuit as and when available, and solve for the updated interface vectors (by appropriate pipelining and without needing to wait for all subcircuit solutions to be available); transmit the results back to the slave processors;

c) Do in parallel on different slave processors: compute the exact correction for the solutions of the individual subcircuits (for the NR iteration under consideration) by including the coupling effects from other partitions, using the LU factors computed in Step a) and the results from the master processor; update the solution for the original circuit;

d) Check if the solution for the overall circuit converged to a predefined error tolerance. If the error is not satisfied, repeat the NR iterations. If satisfied, move to the next time point analysis after checking for the truncation error. Further details are given in the following.

Partitioning

The original circuit is partitioned into multiple subcircuits. Identifying appropriate partitions can be accomplished using the well established methods such as graph based approaches, for which many references are available, such as, J. Vlach et. al., "Computer Methods for Circuit analysis and Design", New York: Van Nostrand, 1983 or the similar hypergraph approaches as described in references such as G. Karypis et al, "Multilevel k-way Hypergraph Partitioning", VLSI Design, Vol. 11, No. 3, pp. 285-300, 2000, and B. Vastenhouw, et al, "A Two-Dimensional Data Distribution Method for Parallel Sparse Matrix-Vector Multiplication", SIAM Review, Vol. 47, No. 1, pp. 67-95, 2005. Construct the graph of the circuit and identify partitions in the given circuit based on the circuit complexity and the number of processors available, such that the size as well as the number of nonlinear elements is fairly distributed among the partitions, while minimizing the links between various partitions.

Once the partitions are identified, the system is then separated into individual subcircuits by adopting the concept of node tearing (described in references such as, R. Rohrer "Circuit partitioning simplified", IEEE transactions on circuits and systems-I, January 1998, pp. 2-5), for time-domain circuits described by nonlinear differential equations. In node tearing, connecting nodes at the separation points are split into two and short-circuit elements are inserted between these torn nodes. The elements on each side of these tears form the new subcircuits. Note that, the node tearing is applicable only for linear resistive circuits. This is addressed in one embodiment by first translating any given general nonlinear time-domain circuit into its companion form at each time point of interest. Such a companion form is purely resistive in nature and hence the concept of node tearing can be suitably applied for accomplishing effective partitioning and parallel circuit simulation.

Transformation of the Given General Circuit into its Companion Form

In one embodiment, all elements (including capacitive, inductive and nonlinear elements, but not restricted to) in the original circuit are represented by their companion forms. The process of constructing a companion model for different types of circuit elements is illustrated with examples in FIG. 3 (for a linear capacitive element and an inductive element), FIG. 4A (for a nonlinear resistor) and FIG. 4B (for a nonlinear capacitor) when using the Backward Euler integration formula. The solution of these equivalent circuits (companion circuits) give the same result as that can be obtained by solving the corresponding original circuits by performing a single iteration of the Newton-Raphson method. It is important to note that the described method can be applied to all types of circuit elements, for linear or nonlinear time-domain formulations, and while using any integration formula (such as, including but not limited to, Trapezoidal Formula, Backward Euler Formula or any Multi-Step Integration Formula, etc.). The types of elements can be general, including but not limited to, inductors, transformers, transmission lines, nonlinear capacitors, diodes and transistors, etc. In the figures, '$t_n$' represents the previous time point and '$t_{n+1}=t_n+h$' represents the current time point, where 'h' is the time step size. The details of the construction of companion forms presented in these figures are given below.

Figure 3:
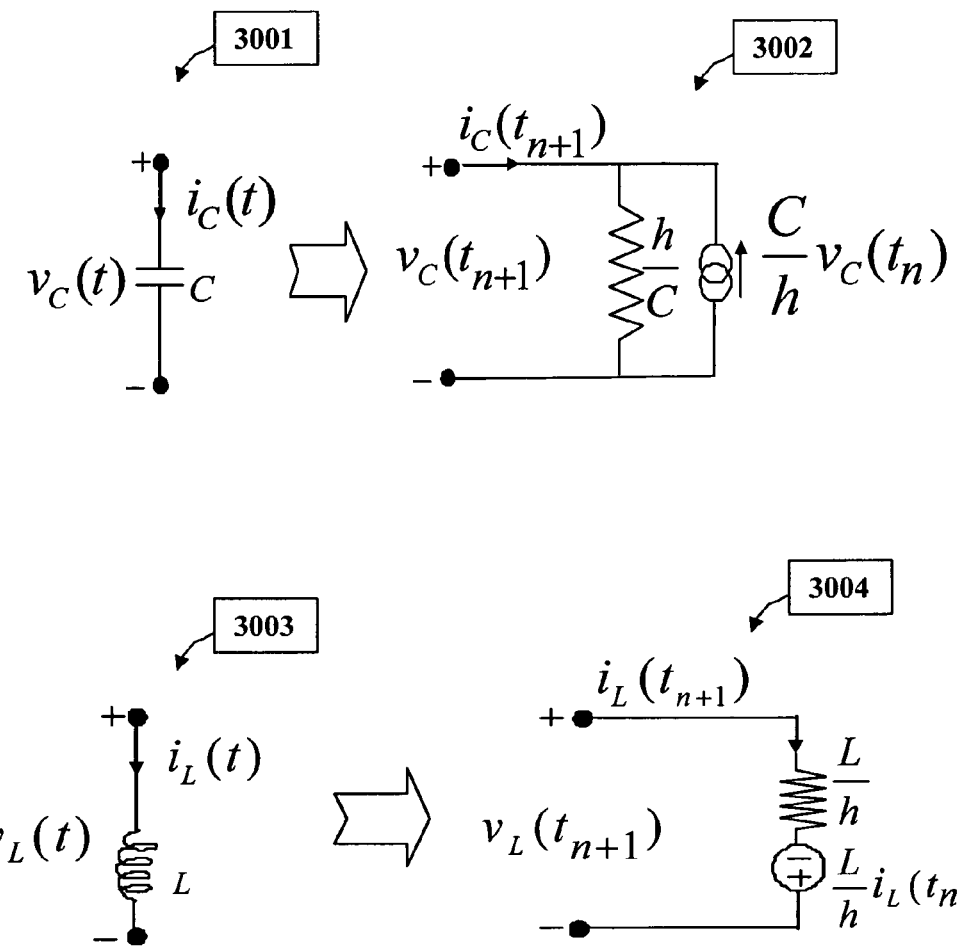
FIG. 3 illustrates the construction of a companion model for a linear capacitive element and an inductor element when using the Backward Euler integration formula. In the figures, '$t_n$' represents the previous time point and '$t_{n+1}=t_n+h$' represents the current time point, where 'h' is the time step size.

For example, consider an energy storage linear element such as a capacitor (C) as represented in FIG. 3, 3001. In the figure, 'C' represents the linear capacitor, $i_C(t)$ represents the current through the capacitor, $v_C(t)$ represents voltage across the capacitor and the current-voltage relationship is given by $$i_C(t) = C\dot{v}_C(t). \quad \text{(Eq. 9)}$$

For the purpose of illustration, the application of the Backward Euler (BE) integration formula gives the following difference equation:

$$i_C(t_n + h) = \frac{C}{h}[v_C(t_n + h) - v_C(t_n)]. \quad \text{(Eq. 10)}$$

Similar relationships can be derived for any other type of integration formulae. The above equation can be represented with an equivalent circuit consisting of a parallel combination of only a resistor and an independent DC current source 3002. The companion resistance is represented by h/C and the companion current source is represented by $(C/h)v_C(t_n)$. The solution of this equivalent circuit at DC gives the same result as that can be obtained by solving the original circuit for a time step of 'h' by applying the BE integration formula.

Similarly, consider an inductive element (L) as represented in FIG. 3, 3003. In the figure, 'L' represents the linear inductor, $i_L(t)$ represents the current through the inductor, $v_L(t)$ represents voltage across the inductor and the current-voltage relationship is given by, $$v_L(t) = L\dot{i}_L(t). \quad \text{(Eq. 11)}$$

For the purpose of illustration, the application of the Backward Euler (BE) integration formula gives the following difference equation:

$$v_L(t_n + h) = \frac{L}{h}(i_L(t_n + h) - i_L(t_n)). \quad \text{(Eq. 12)}$$

This equation can be represented with an equivalent circuit 3004 consisting of a parallel combination of only a resistor and an independent DC voltage source. The companion resistance is represented by $L/h$ and the companion voltage source is represented by $(L/h)i_L(t_n)$.

A companion circuit can also be found to represent nonlinear components. For the purpose of illustration, consider the nonlinear resistor shown in FIG. 4A, 4001 with a nonlinear behavior defined by $$i_R(t) = f(v_R(t)) \quad \text{(Eq. 13)}$$

where $i_R(t)$ represents the current through the nonlinear resistor and $v_R(t)$ represents voltage across the nonlinear resistor. Let $$\Phi(v_R(t_{n+1})) = f(v_R(t_{n+1})) - i_R(t_{n+1}). \quad \text{(Eq. 14)}$$

By applying the Newton-Raphson method to this equation, linearized NR equations can be formed. The corresponding companion relationship between the current and the voltage during the $(j+1)^{th}$ NR iteration at a time point $t_{n+1}$ is represented by 4003, 4004. These equations can be further represented by a purely resistive equivalent circuit 4002, where the companion resistance represented by $R_{Nr}$ is computed as in 4005 and the companion current source represented by $I_{Nr}$ is computed as in 4006.

A companion circuit can also be found to represent other types of nonlinear components. For the purpose of illustration, consider the nonlinear capacitor shown in FIG. 4B, 4011. The current through the capacitor is represented by $i_C(t) = dQ(t)/dt$, with $Q(t)$ being a nonlinear function of $f(v_C(t))$, given by $Q(t) = f(v_C(t))$ 4014, where $Q(t)$ is the charge in the capacitor and $v_C(t)$ represents voltage across the nonlinear capacitor. The companion relationships between the current and the voltage during the $(j+1)^{th}$ Newton-Raphson iteration at time point $t_{n+1}$ can be represented as shown in 4015 and 4018. These equations can be further represented by equivalent circuits 4012 and 4013 where the linear resistance represented by $R_{NC}$ is computed as in 4016 and the current source represented by $I_{NC2}$ is computed as in 4017.

The companion model construction process described above can be applied to all types of circuit elements, for linear or nonlinear time-domain formulations, and while using any integration formula. The types of elements can be general, including but not limited to, inductors, transformers, transmission lines, nonlinear capacitors, diodes, and transistors, etc.

The original circuit in which all the elements are represented by their companion forms (at each time point and during each NR iteration) as described above has the following characteristics:

a) The resulting companion circuit consists solely of linear resistors and independent sources (in other words, all the nonlinear and energy-storage elements of the original circuit are effectively translated to a linear circuit with only resistors and sources).

b) The time-domain response of the original circuit at any given time point is obtained by simply updating the linearized (resistive) component and current source values based on the step size and previous time point solutions, which is further refined using Newton Raphson iterations until the convergence is achieved.

c) The main advantage of constructing the companion form is that, since the companion circuit of a general nonlinear time-domain circuit so constructed at each time point and NR iteration is purely resistive, the node tearing technique, which is applicable only to resistive circuits, can now be exploited for effective partitioning of the original nonlinear time-domain circuit for parallel analysis.

The process of node splitting that specifically leads to binary interfacing vectors, which consequently offers significant advantages for parallel simulation is illustrated through examples below.

Partitioning Via Node Tearing for Parallel Transient Analysis

Figure 5:
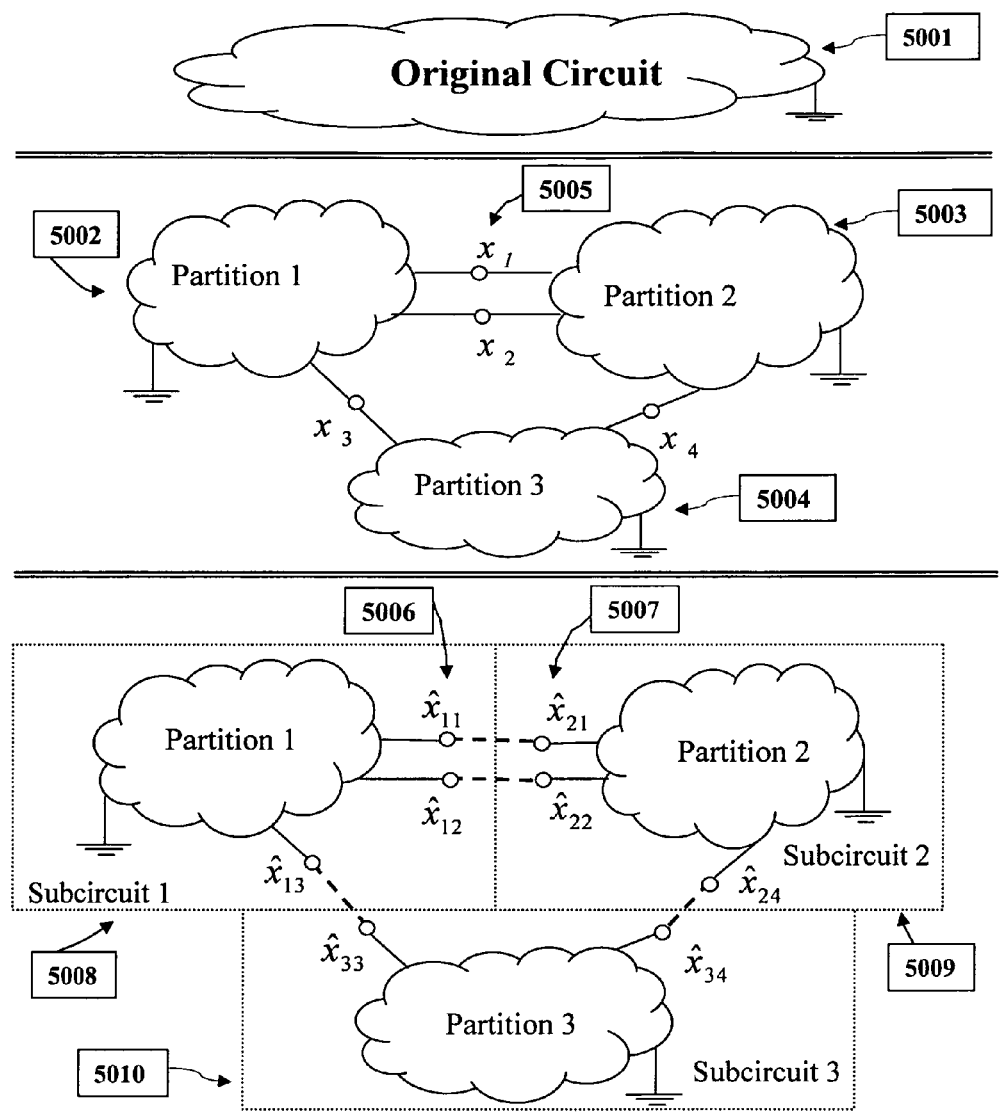
FIG. 5 illustrates the process of identifying partitions, node tearing and construction of the subcircuits.

To illustrate the node tearing process adopted for the proposed parallel simulation, let the original circuit in its companion form be represented as in FIG. 5, 5001. For the purpose of illustration, without loss of generality, let three partitions be identified for this circuit, represented by 5002, 5003, 5004, connected by four nodes, $x_1$ to $x_4$. If the circuit is to be split into three subcircuits, each of the nodes $x_1$ to $x_4$ needs to be torn. For illustration, let the original node $x_1$ (connecting partitions 1 & 2) 5005 be split into two nodes, namely, $\hat{x}_{11}$ 5006 and $\hat{x}_{21}$ 5007. Similar splitting of other identified nodes leads to three subcircuits: 5008, 5009, 5010. In general, a node $x_i$ connecting partitions M and N is split into $\hat{x}_{Mi}$ (with this node being grouped into subcircuit 'M') and $\hat{x}_{Ni}$ (with this node being grouped into subcircuit 'N'). When this torn pair of nodes are connected by respective short circuits, the original system is re-constituted.

Let $n_p$ be the number of partitions, $n_t$ the number of short-circuit links between torn nodes, $q_{kj}$ a column vector representing the connectivity of the $j^{th}$ link with the nodes in the $k^{th}$ partition. The procedure for constructing the binary interfacing vectors is as follows:

a) Let the $j^{th}$ link is between partitions a and b.

b) Initialize $q_{aj} = \{0\}$ as a column vector with the same dimensions as $x_a$ and $q_{bj} = \{0\}$ as a column vector with the same dimensions as $x_b$.

c) For $q_{aj}$, set an entry of '1' in row $n_a$, where $n_a$ is the row of $x_a$, corresponding to the link's node in partition 'a'. For $q_{bj}$ set an entry of '−1' in row $n_b$, where $n_b$ is the row of $x_b$, corresponding to the link's node in partition b.

Arranging $q_{kj}$ as column vectors, a coupling matrix $Q_k$ can be defined as $$Q_k = [q_{k1} \ldots q_{kn_t}] \quad \text{(Eq. 15)}$$

It is to be noted that, important merits of the proposed algorithm comes from the fact that the vectors, $q_{kj}$, are purely binary in nature, with all entries '0', except for only one of the entries in them containing '±1'. This leads to significant reduction in the computational and communication cost among processors during parallel computation.

In one embodiment, it is further noted that, there will be typically several $q_{kj}$ vectors (in $Q_k$) that are zero vectors. Exploiting this fact, to reduce the computational and communication overhead during parallel computation, $Q_k$ is reformulated as $$Q_k = \hat{Q}_k P_k \quad \text{(Eq. 16)}$$

where $P_k$ is a permutation matrix (with binary numbers) and $\hat{Q}_k$ represents the truncated version of $Q_k$ with all zero and duplicate columns omitted.

In the new invention, the entire circuit matrix for the original circuit is never constructed. On the other hand, only the companion circuit of each subcircuit is constructed. For example, for the subcircuits 5008, 5009, 5010 shown in FIG. 5, the individual linearized circuit equations can be written at any Newton iteration (at any time point of interest) as:

$$G_1\hat{x}_1 = b_1; \quad G_2\hat{x}_2 = b_2; \quad G_3\hat{x}_3 = b_3; \qquad \text{(Eq. 17)}$$

where the MNA matrix of each subcircuit is represented by $G_k$ and the solution vector for each subcircuit is represented by $\hat{x}_k$.

In one embodiment, the solution of each subcircuit is then updated to obtain the exact solution ($x_k$) taking into account the coupling with all other partitions, using the following exact relationship:

$$x_k = \hat{x}_k - G_k^{-1}\hat{Q}_k P_k Z^{-1} \sum_{i=1}^{n_p} P_i^T \hat{Q}_k^T \hat{x}_i \qquad \text{(Eq. 18)}$$

$$Z = \sum_{i=1}^{n_p} Z_i; \quad Z_i = P_i^T \hat{Q}_i^T G_i^{-1} \hat{Q}_i P_i$$

Note that, having the solutions of individual subcircuits from (14), equation (18) gives an exact relation (in other words, without loss of any accuracy like in iterative refinement based techniques) to obtain the exact solution for the subcircuits while accounting for the coupling from other partitions at a given NR iteration.

Figure 6A:
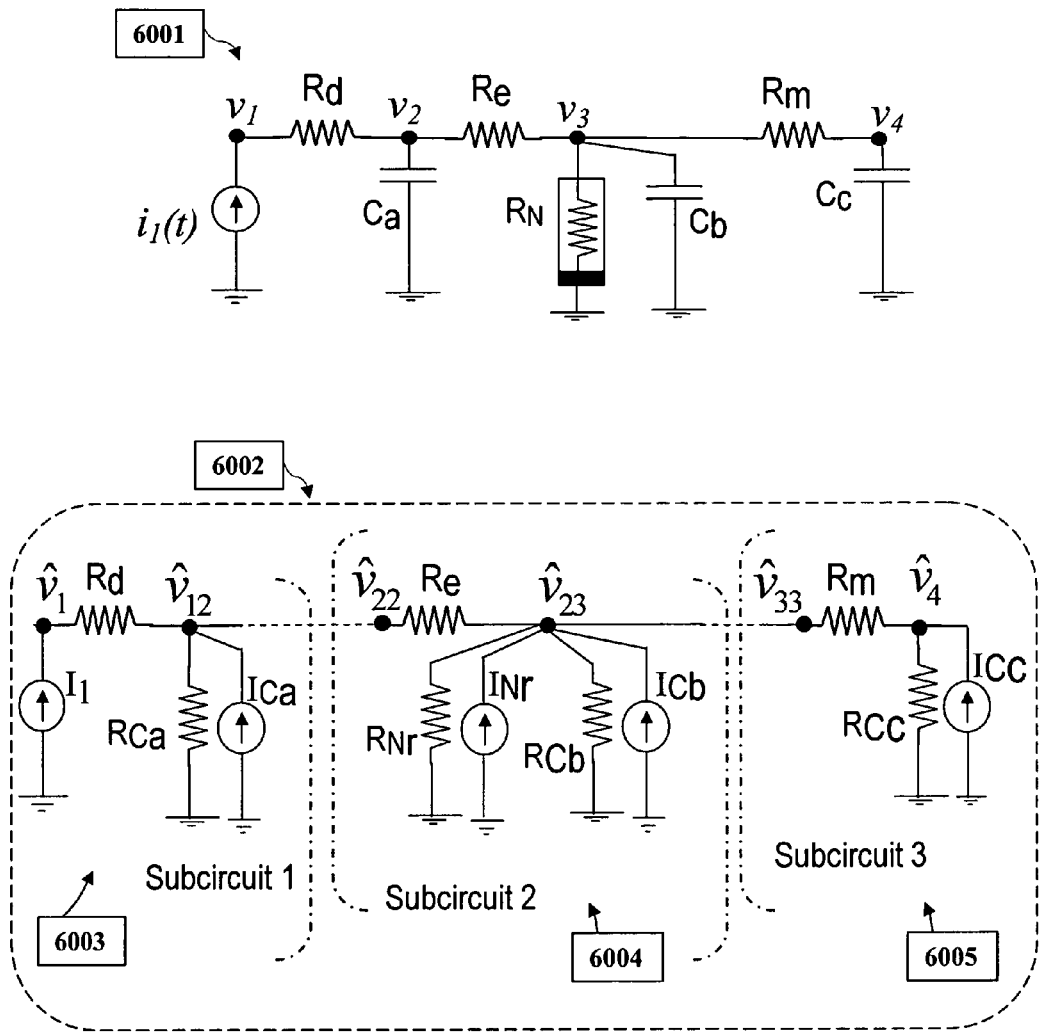
FIG. 6 illustrates the proposed formulation of circuit equations for the proposed parallel circuit simulation, through an example circuit.

A detailed illustration of the proposed formulation involving partitioning, companion form representation, node tearing and formulation of subcircuit equations and the interface matrices is given in FIG. 6A and FIG. 6B. In the figure, 6001 represents an example circuit for the illustration of the construction of the subcircuits using the companion form and node tearing. Here $R_e$, $R_d$, $R_m$ are linear resistors, $C_a$, $C_b$, $C_c$, are the linear capacitors and $R_N$ represents a nonlinear resistor. $i_1(t)$ represents an independent current source. $v_1$, $v_2$, $v_3$, $v_4$, represent the unknown node voltages, which need to be computed at every time point of interest. 6002 shows an illustrative partitioning of the companion form of the original circuit (at the $j^{th}$ Newton-Raphson iteration during the analysis at time point $t_{n+1}$) into three subcircuits: 6003, 6004, 6005. Node $v_2$ was torn into $\hat{v}_{12}$ and $\hat{v}_{22}$; and node $v_3$ was torn into $\hat{v}_{23}$ and $\hat{v}_{33}$. In the figure, $R_{Ca}$, $I_{Ca}$ represent the companion resistance and the companion source corresponding to the capacitor $C_a$. $R_{Cb}$ and $I_{Cb}$ represent the companion resistance and the companion source corresponding to the capacitor $C_b$. $R_{Cc}$ and $I_{Cc}$ represent the companion resistance and the companion source corresponding to the capacitor $C_c$. $R_{Nr}$ and $I_{Nr}$ represent the companion resistance and the companion source corresponding to the nonlinear resistor. $I_1$ represents the independent source current at time point $t_{n+1}$. Formulation of subcircuit equations and the interface vectors using the proposed algorithm are given by 6006, 6007, 6008, 6009. In the figure, x represents the vector of unknown solution vector of the original circuit 6006, $\hat{x}_k$ represents the vector of unknown voltages of subcircuit 'k', $G_1\hat{x}_1 = b_1$ 6007 represents the modified nodal admittance equations for the subcircuit-1 and $Q_1$ represents the binary interface matrix for the subcircuit-1, $G_2\hat{x}_2 = b_2$ 6008 represents the modified nodal admittance equations for the subcircuit-2 and $Q_2$ represents the binary interface matrix for the subcircuit-2, $G_3\hat{x}_3 = b_3$ 6009 represents the modified nodal admittance equations for the subcircuit-3 and $Q_3$ represents the binary interface matrix for the subcircuit-3.

Parallel Solution of NR Equations Using the Proposed Algorithm

Figure 7:
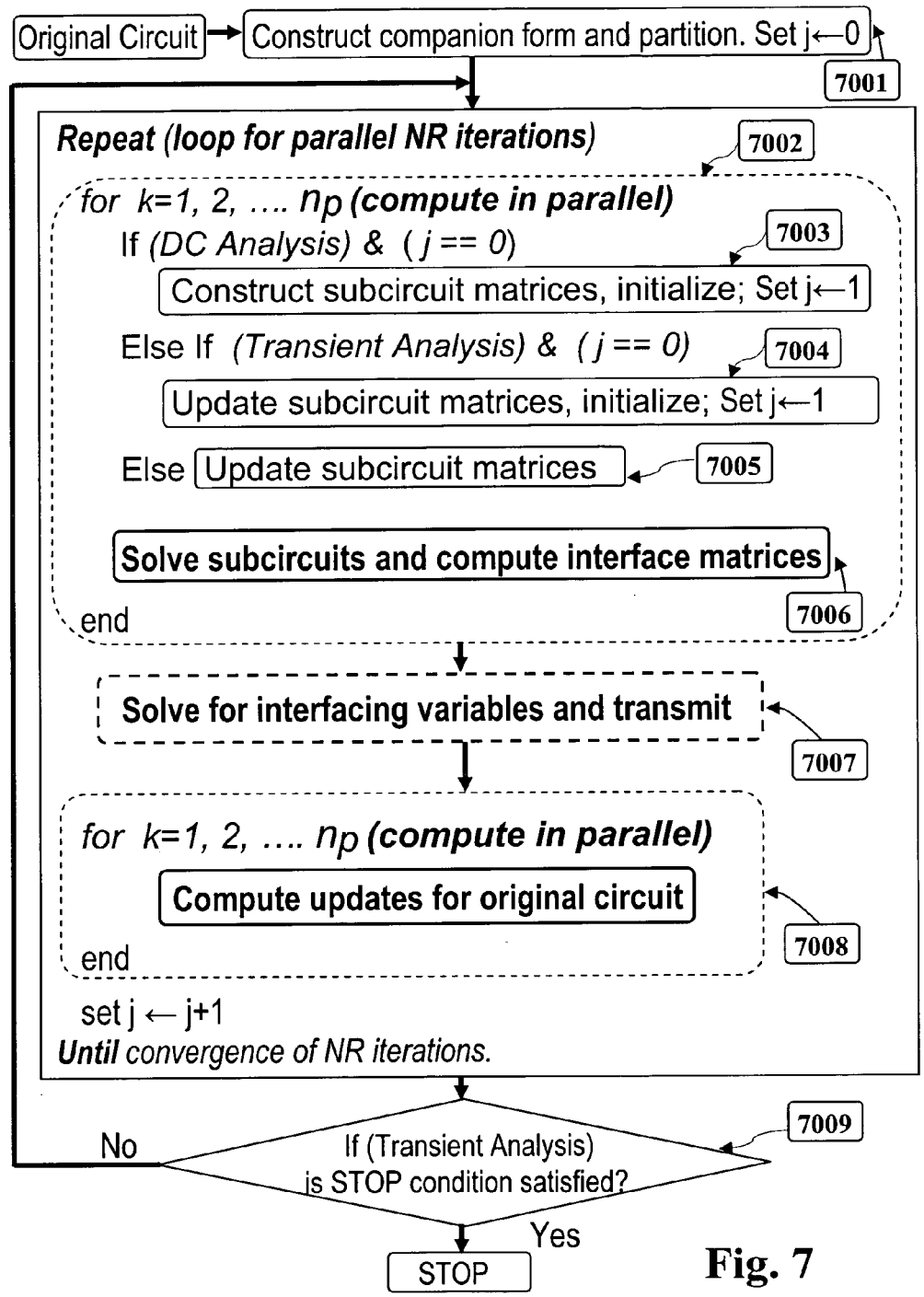
FIG. 7 describes a preferred embodiment in terms of a pseudocode for the proposed parallel circuit simulation on multiprocessor computing environments.

In one embodiment, an efficient parallel computation mechanism for obtaining the solution $x_k^{(j)}$ during a $j^{th}$ NR iteration at any given time point, from (15) using sparse LU factorization and few forward/back substitution is developed as follows:

a) Perform in parallel on a plurality of slave processors:
  a1) represent each subcircuit, through a linear set of equations using the companion form representation, $G_k^{(j)}\hat{x}_k^{(j)} = b_k^{(j)}$.
  a2) solve each of the subcircuit equations using LU decomposition and forward/backward substitutions:

$$G_k^{(j)} = L_k^{(j)} U_k^{(j)}; \quad L_k^{(j)}\Phi^{(j)} = \Omega^{(j)};$$

$$U_k^{(j)}\Delta x_k^{(j)} = \Phi^{(j)}. \qquad \text{(Eq. 19)}$$

a3) compute the interfacing results, $\Gamma_k^{(j)}$, $Z_k^{(j)}$, $\beta_k^{(j)}$ using the above LU factors ($L_k^{(j)}$, $U_k^{(j)}$) and few forward/backward substitutions from the relations:

$$G_k^{(j)}\Gamma_k^{(j)}(t) = \hat{Q}_k; \qquad \text{(Eq. 20)}$$

$$Z_k^{(j)} = P_k^T \hat{Q}_k^T \Gamma_k^{(j)}(t) P_k;$$

$$\beta_k^{(j)} = P_k^T \hat{Q}_k^T \hat{x}_k^{(j)}(t). \qquad \text{(Eq. 21)}$$

a4) transmit $\beta_k^{(j)}$, $Z_k^{(j)}$ to the master processor.
b) Perform on master processor:
  b1) construct and solve:

$$Z^{(j)} = \sum_{k=1}^{n_p} Z_k^{(j)}; \quad \beta^{(j)} = \sum_{k=1}^{n_p} \beta_k^{(j)}; \qquad \text{(Eq. 22)}$$

$$Z^{(j)}\alpha^{(j)} = \beta^{(j)}. \qquad \text{(Eq. 23)}$$

b2) transmit the solution a back to the slave processors.
c) Perform in parallel for each subcircuit on a plurality of slave processors: compute using the already computed LU factors ($L_k^{(j)}$, $U_k^{(j)}$; from equation (19)):

$$G_k^{(j)}\gamma_k^{(j)} = \hat{Q}_k P_k \alpha^{(j)}; \quad x_k^{(j)}(t) = \hat{x}_k^{(j)}(t) - \gamma_k^{(j)} \qquad \text{(Eq. 24)}$$

where $x_k^{(j)}(t)$ represents the exact solution of the NR equations for the subcircuit 'k', including the effects of coupling with all adjoining subcircuits for the $j^{th}$ iteration. A preferred pseudocode using the above process for transient simulation of general nonlinear circuits is given in FIG. 7. Persons of ordinary skills in the art with the benefit of this description appreciate that the disclosed inventive concepts lend themselves to other equally effective embodiments and may be practiced without some of the specific details or with minor modifications to the described ones here. In FIG. 7, 7001 let $t_n$ be the previous time point, $t=t_n+h=t_{n+1}$ be the current time point, where 'h' is the time step and $t_{max}$=upper limit of time span of interest. Let x represent the MNA variables of the original circuit. Partition the companion circuit into $n_p$ subcircuits, such that one or more subcircuits can be assigned per CPU. On slave processors, perform 7002 by appropriately evaluating the tasks 7003 (construct $G_k$, $P_k$, $Q_k$, $b_k$ from $k^{th}$ companion subcircuit and store; $x \subset \{x_1, x_2 \ldots x_{n_p}\}$; initialize $[[x_k^{(0)}(0)]] \rightarrow$ Initial State of the circuit) or 7004 (update $G_k$, $b_k$ to reflect the present time point, initialize $[[x_k^{(0)}(t)]] \rightarrow [x_k(t_n)]$) or 7005 (update $G_k$, $b_k$ to reflect the present ($j^{th}$) NR iteration, using companion form of elements). Subsequently, execute 7006 (in parallel) by solving: $G_k^{(j)}\hat{x}_k^{(j)}(t) = b_k^{(j)}(t)$ (solve using LU decomposition and F/B substitution; represents the independent solution of individual subcircuits on parallel slave processors; LU factors are retained for further steps); equation (20) (solve using F/B substitution; can also be scheduled in parallel, if necessary; note here that the RHS is purely binary here); and equation (21) (multiplications involving binary vectors) and transmitting the results ($Z_k^{(j)}$, $\beta_k^{(j)}$) back to the master. Subsequently execute 7007 by computing equation (22) and solving equation (23) on a master processor [solve using LU & F/B substitution; note that the master processor doesn't need to wait for the solution of all subcircuits, but can start the operations for LU decomposition and forward substitution to obtain the solution as and when any individual subcircuit solutions become available (or can also be solved using iterative techniques, in which case the corresponding task can be easily scheduled in parallel on slave computers without needing to construct the full Z and $\beta$)] and transmitting the result $\alpha$ back to the slave processors. Subsequently, 7008 is executed in parallel on slave processors to solve equation (24) (using F/B substitution) to compute $x_k^{(j)}(t)$ (which represents the exact solution of the subcircuit 'k', for the NR iteration 'j', taking into account of the coupling with all other subcircuits). Once the NR iterations are converged, a check for stop criterion for transient analysis performed 7009 (if truncation error is greater than a predefined error tolerance ($\epsilon_{te}$), then modify 'h' and repeat the NR iterations loop, else if $t_n < t_{max}$ then set $t_n = t_{n+1}$ and proceed to new time point analysis, with new set of NR iterations).

In a feature of one embodiment, in case of circuits with large number of partitions and/or each partition with large number of links with other partitions, evaluation of (17) and (20) using forward/backward substitutions can be time consuming. In such cases, the operations of forward/backward substitutions can be further parallelized by dynamically pipelining on slave computers, which not only reduces the wall time but also helps to balance the workload on different processors.

In another feature of one embodiment, for cases when Z-matrix becomes larger, a fast solution of $Z^{(j)}\alpha^{(j)} = \beta^{(j)}$ can be obtained through iterative techniques, wherein the solution process can be further parallelized on separate processors, without needing to construct the full Z-matrix on a master processor. The initial guess for the iterative process can be selected as the solution from the previous time point or through an LU decomposition based solution of $Z^{(j)}\alpha^{(j)} = \beta^{(j)}$ at every time point for the first NR iteration, and using the corresponding solution as the initial guess for the subsequent NR iterations at that time point.

It is to be noted that the embodiments of the new invention can also be applied directly to the operating-point (DC) simulation of the circuit. For this case, the companion form is used with the MNA formulation as before, with the energy-storage elements being replaced by their DC equivalents.

It is also to be noted that the concepts of the new invention can be applied for frequency-domain simulations. For this purpose, the companion form is not used but instead the circuit is linearized at the operating point of interest. This linearized circuit can then be converted to a MNA formulation. The embodiments of the new invention can then be used to solve this system of equations at each desired frequency point, taking care that many of the variables will now contain complex numbers instead of purely real ones.

Second Embodiment

A serial simulator for analysis of linear/nonlinear time-domain circuit and mixed-domain formulations on a single processor according to a second embodiment is explained below.

Figure 8:
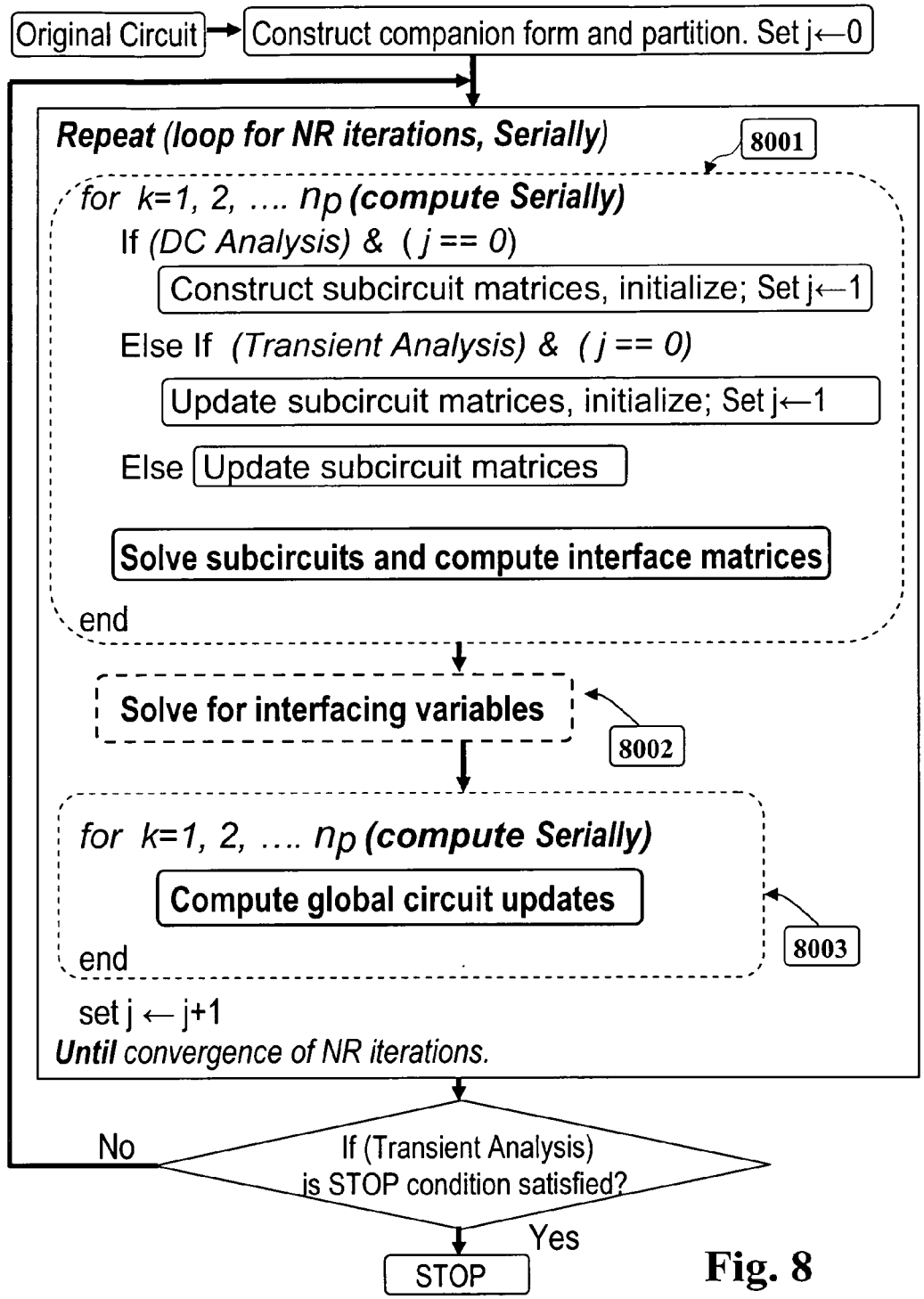
FIG. 8 describes a preferred embodiment in terms of a pseudocode for simulation using a single processor using the proposed partitions.

As a feature of the second embodiment, the inventive concepts of the new invention are also exploited for fast and accurate simulation on a single processor. In this case, the partitions are identified and subcircuits are formed as per the first embodiment, using the companion form representation and node tearing. Equations (19) to (24) are constructed/updated/solved sequentially on a single processor. A preferred pseudocode for the second embodiment is given in FIG. 8, where the details of the variables and modules are similar to the ones described for the case of FIG. 7, except that the modules 8001, 8002 and 8003, are executed serially.

It is to be noted that, using the features of the second embodiment, in general leads to a better speed up on a single processor than running the original circuit without any partitioning. This is because, in general, the computational cost of LU decomposition of circuit matrices is proportional to $N^\sigma$, where N represents the matrix size and $\sigma$ represents the sparsity factor. For typical circuits, $\sigma$ varies from 1.3 to 1.7. Obviously, larger the N, the larger is CPU cost. For modern electronic circuits, N can be very large, in the range of millions. Hence, simulation can be speeded up by dividing the original circuit into several smaller subcircuits (say of size $N_s \ll N$), and solving each subcircuit independently (to exploit the fact that $N_s^\sigma \ll N^\sigma$) and later combining the subcircuit results to get the solution of the original circuit. Speed-up is possible only if the computational cost for combining the results is kept to minimum, which the new invention has achieved.

Third Embodiment

The third embodiment provides for further enhancing the overall simulation speed-up by combining the merits of the first and second embodiments. According to the third embodiment, parallel simulation of a given nonlinear time-domain circuit is accomplished via a hierarchical partitioning. In this case, circuit is partitioned with subcircuits having minimal links and is solved using the first embodiment. In this case, while solving for an individual subcircuit on a particular processor, if the size of the subcircuit is still large, it is further partitioned and simulated exploiting the features of the second embodiment. The third embodiment is suitable for and yields better speed-ups when the first level partitioned subcircuits are still of large size and/or cause excessive links between subcircuits.

Further, as an alternative to direct multi-way partitioning, hierarchical partitioning can also be used to reduce the overall number of links among the subcircuits. In hierarchical partitioning, the original circuit is partitioned into a certain number of subcircuits, and each of these subcircuits is then partitioned again, and so on as required. This results in a tree structure of subcircuits, which can be simulated by applying the methods of this invention recursively to the structure.

We claim:
1. A method at a processing system having at least a master processor for simulation of an electrical circuit, the method comprising:
   mapping connectivity of the electrical circuit at the master processor, utilizing nonlinear differential algebraic equations (NDAEs):
   partitioning the electrical circuit into a plurality of sub-circuits at the master processor, the partitioning using is Companion Form representation of the electrical circuits and node tearing;
   representing coupling between the plurality of sub-circuits as binary vectors at the master processor; and obtaining interface results for each sub-circuit, the obtaining comprising:
sending each of the plurality of sub-circuits, including binary interface vectors from the master processor to a plurality of slave processors; and
receiving the interface results back at the master processor.

2. The method of claim 1, further comprising, in parallel at each slave processor, receiving, at the slave processor, each of the plurality of sub-circuits, including binary interface vectors; solving each of the plurality of sub-circuits at the slave processor, the solving using lower upper matrix decomposition and forward backward substitution; solving interface results at the slave processor for each of the sub-circuits using the sub- circuit solutions, binary vectors and reusing sub-circuit lower upper matrix factors; and transmitting the interface results back to the master processor.

3. The method of claim 1, further comprising:
collecting and updating the interface results at the master processor, and
transmitting the updated interface results to the plurality of slave processors to update the sub-circuit solutions by reusing the sub-circuit lower upper matrix factors.

4. The method of claim 3, wherein the updating of interface vectors at the master processor starts prior to receiving the results from all slave processors.

5. The method of claim 2, wherein the solving interface results comprises utilizing a parallelized solution on separate processors.

6. The method of claim 2, wherein the solving interface results comprises utilizing an iterative process.

7. The method of claim 1, wherein the obtaining uses a Newton-Raphson iteration at any time point including direct current.

8. The method of claim 1, wherein the obtaining utilizes a serial process.

9. The method of claim 1, wherein the partitioning uses hierarchical partitioning to reduce a number of links between sub-circuits.

10. A processing system for simulation of an electrical circuit having:
a master-processor; and
a plurality of slave processors;
the system configured to:
map connectivity of the electrical circuit at the master processor, utilizing nonlinear differential algebraic (NDAEs);
partition the electrical circuit into a plurality of sub-circuits at the master processor, the partitioning using a Companion Form representation of the electrical circuits and node tearing;
represent coupling between the plurality of sub-circuits as binary vectors at the master processor; and
obtain interface results for each sub-circuit, the obtaining comprising:
sending each of the plurality of sub-circuits, including binary interface vectors, from the master processor to the plurality of slave processors; and
receiving the interface results back at the master processor.

11. The system of claim 10, wherein each slave processor of the plurality of slave processors, is configured to:
receive each of the plurality of sub-circuits, including binary interface vectors:
solve each of the plurality of sub-circuits, the solving using lower upper matrix decomposition and forward backward substitution;
solve interface results for each of the sub-circuits using the sub-circuit solutions, binary vectors and reusing sub-circuit lower upper matrix factors; and
transmit the interface results back to the master processor.

12. The system of claim 10, wherein the master processor is further configured to:
collect and update the interface results, and
transmit the updated interface results to the plurality of slave processors to update the sub-circuit solutions by reusing the sub-circuit lower upper matrix factors.

13. The system of claim 12, wherein the system is configured to update interface vectors at the master processor by starting prior to receiving the results from all slave processors.

14. The system of claim 11, wherein the system is configured to solve interface results by utilizing a parallelized solution on separate processors.

15. The system of claim 11, wherein the system is configured to solve interlace results b utilizing an iterative process.

16. The system of claim 10, wherein the system is configured to obtain using a Newton-Raphson iteration at any time point including direct current.

17. The system of claim 10, wherein the system is configured to obtain using a semi process.

18. The system of claim 10, wherein the system is configured to partition using hierarchical partitioning to reduce a number of links between sub-circuits.

\* \* \* \* \*